United States Patent [19]
Larson, III et al.

[11] Patent Number: 5,661,445
[45] Date of Patent: Aug. 26, 1997

[54] SUPERCONDUCTIVE MAGNET ASSEMBLY

[75] Inventors: John D. Larson, III, Palo Alto, Calif.; Jeremy A. Good, London, United Kingdom

[73] Assignee: Hewlett-Packard Company, Palo Alto, Calif.

[21] Appl. No.: 655,552

[22] Filed: May 30, 1996

[30] Foreign Application Priority Data

Jun. 1, 1995 [GB] United Kingdom ............... 9511086

[51] Int. Cl.$^6$ ............... H01F 1/00; G01V 3/00
[52] U.S. Cl. ............... 335/216; 324/318
[58] Field of Search ............... 335/216; 324/309, 324/318

[56] References Cited

U.S. PATENT DOCUMENTS

| | | | |
|---|---|---|---|
| 5,289,128 | 2/1994 | DeMeester et al. | 335/216 |
| 5,332,972 | 7/1994 | Takenouchi | 324/318 |
| 5,349,297 | 9/1994 | DeMeester et al. | 335/216 |
| 5,485,088 | 1/1996 | Westphal et al. | 335/216 |
| 5,489,848 | 2/1996 | Furukawa | 324/318 |
| 5,568,051 | 10/1996 | Yamagata | 324/318 |
| 5,572,132 | 11/1996 | Pulyer et al. | 324/318 |
| 5,594,401 | 1/1997 | Dorri et al. | 335/216 |

FOREIGN PATENT DOCUMENTS

| | | | |
|---|---|---|---|
| 0562708A1 | 9/1993 | European Pat. Off. | 33/38 |
| 2622427 | 5/1989 | France | 5/5 |

*Primary Examiner*—Stuart N. Hecker

[57] ABSTRACT

A superconductive magnet assembly is disclosed. The superconductive magnet assembly includes a primary magnet formed of a coil of superconductive material, a magnet former supporting the primary coil, a plurality of gradient coils of superconductive material operative to produce field gradients during operation of the magnet, and a radiation shield within which the primary coil and the gradient coils are housed. The gradient coils are supported by the magnet former.

12 Claims, 1 Drawing Sheet

SUPERCONDUCTIVE MAGNET ASSEMBLY

FIELD OF THE INVENTION

The present invention relates to a superconductive magnet assembly for use, for example, in a magnetic resonance imaging system of the the employed in medical diagnostic investigations of an animal or human body or other tissue.

DESCRIPTION OF THE INVENTION

Figure 1:
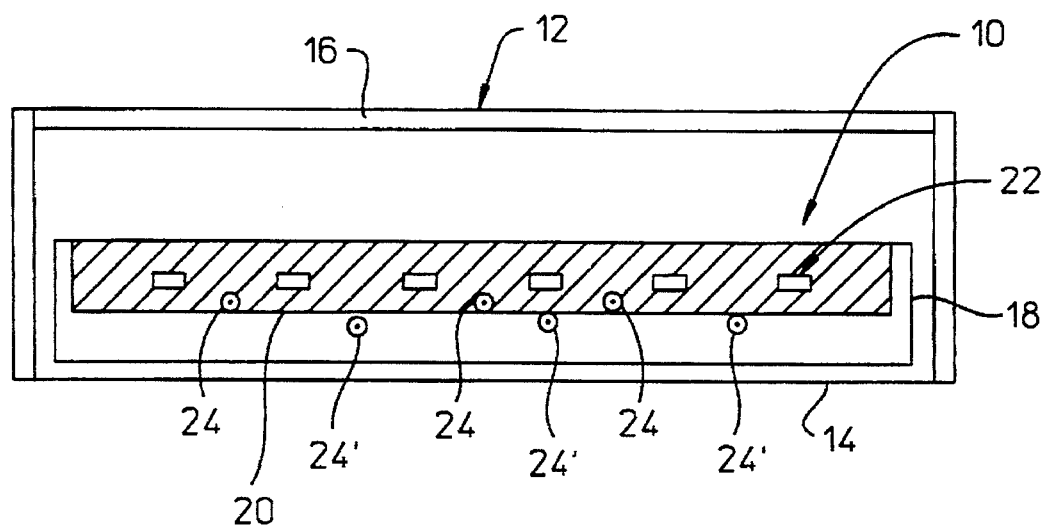
FIG. 1 is a schematic cross-sectional diagram of part of an embodiment of the superconductive magnet assembly according to the present invention.

Magnetic resonance imaging (MRI) systems used for obtaining images of intact biological systems of a human being typically include a primary superconductive magnet provided as a coil of superconductive material supported on a tubular former. The primary magnet is designed to produce a primary field of between 3000 and 20,000 gauss and is housed in a chamber cooled in some cases to around 4 Kelvin. In order to produce such temperatures, it is common to use liquid helium, for which a metal housing is required to prevent diffusion to and from the housing of the helium. Thermal insulation is provided by a vacuum vessel which must also be made impervious to diffusion of all helium and other gases such as water vapour.

Typically, the former and vacuum vessel are made from a metal and has an internal diameter of around 1 meter and a length of around 2 to 3 meters. The internal diameter of the former is larger than would actually be required to receive a human patient as a result of requiring space for the gradient or pulse coils used for generating field gradients in the three orthogonal directions relative to the principal magnetic field. The gradient coils are typically annular and are located within the internal wall of the primary magnet. They are normally kept at room temperature.

As a result of the nature of the gradient coils, It is necessary to have substantial heat insulation between the low temperature primary coil and the gradient coils so as to insulate the primary coil both from the higher environmental temperature of the gradient coils and from the heat generated during use of these coils. Moreover, it is necessary to shield the primary magnet from the gradient coils to prevent loss of quality of the generated magnetic fields. Such insulation is typically provided by means of an active shield disposed between the gradient coils and the primary magnet and operative to annul the field produced by the gradient coils in the direction of the primary magnet. The active shield is typically annular so as no fit in a space between the primary magnet and the gradient coils.

A prior art superconductive magnet of the above type suffers from a number of disadvantages, some of which have been considered inevitable in the art. As a result of the nature of the gradient coils, the primary magnet must have a larger internal diameter than the usable internal diameter of the system, which is typically between 600 to 650 millimeters for a MRI system. It is also necessary to provide a significant amount of peripheral components, such as heat insulators, the electromagnetic shield and so on. Moreover, the structure of the gradient coils and primary magnet is such that the system produces very significant levels of noise at around a few hundred Hertz, which being within a sensitive part of the audible range can produce anxiety in many patients.

The present invention seeks to provide an improved superconductive magnet assembly.

According to an aspect of the present invention, there is provided a superconductive magnet assembly comprising a primary magnet formed of a coil of superconductive material, a magnet former supporting the primary coil, one or more gradient coils of superconductive material operative to produce field gradients during operation of the magnet, the or each gradient coil being supported by the magnet former, and a heat insulating housing within which the primary coil and the or each gradient coil are housed.

By using gradient coils of superconductive material and by placing these within the cooled housing, it is possible to dispense with certain peripheral components, such as the active or other shield between the gradient coils and the primary magnet, thereby making substantial savings. Moreover, with this structure, the internal diameter of the superconductive magnet can be made much smaller so as to approach the usable internal diameter of any machine in which it is fitted, thereby reducing field losses, the amount of superconductive wire required and the overall size of the magnet assembly.

It has also been found with this structure that the primary coils and the gradient coils can be disposed relative to one another so as not to produce the loudspeaker effect of prior art magnet assemblies of this type, with the result that a substantial reduction in audible noise can be attained.

The magnet may be cooled by a cryo-refrigerator. With such a system, there is no need for liquid helium cooling and no need for a metallic housing, which can significantly disturb the field gradient pulses.

The gradient coil or coils are preferably designed so as to dissipate heat at the lowest rate practicable such that the means for refrigeration can be provided at the lowest cost possible.

The magnet former may be formed of electrically non-conductive material, such as a fibre glass or a plastics material, thereby to enable both the primary coil and the gradient coil or coils to be coupled directly to the magnet former. The vacuum vessel may be provided with a relatively thin metal layer to act as a barrier to diffusion of gases into the vacuum housing. The thickness of the metal layer is governed by sheet resistivity and the degree of prevention of diffusion, as will be apparent to the skilled person.

Preferably, the magnet former is of tubular form, the primary coil being disposed on one side of the support. The gradient coil or coils may be disposed on the same side of the magnet former or on the opposite side thereof. In either position, the gradient coils are preferably spaced from the primary coil so as to reduce induction between the two types of coil and thereby the need for shielding therebetween.

The magnet former may be of any other suitable shape, for example C-shaped or of any other shape which will be apparent to the person skilled in the art.

The or each gradient coil may be formed from one or more superconductive filaments or wires covered with electrically insulating or highly resistive material. Such gradient coils will dissipate relatively little power at high currents and can enable systems incorporating the magnet assembly to be used at higher speeds, thereby enabling imaging systems to produce images virtually in real time.

Preferably, the gradient coil has many filaments with a diameter in the order of 0.1 micrometers, thereby to provide a large surface area.

The gradient coil filaments may be produced by extrusion into an insulating or resistive matrix or may be formed by a film deposition process in which a superconductive film is deposited onto a resistive substrate. Any other suitable method may be used.

Preferably, the filaments are transposed so as to carry the same gradient current.

A film deposition process may involve depositing a superconductive alloy on an insulating substrate with high heat conductivity, such as sapphire, alumina, various ceramics or diamond. Such a heat conductive substrate can provide thermal stabilisation against quenches and can minimise electric power dissipation in the substrate. The film deposition may be by a process of sputtering, by chemical vapour deposition, by flash evaporation or by any other suitable process.

Alternatively, the gradient filaments may be produced from conventional metal clad superconductive filaments from which the cladding is removed, for example by etching, and replaced by an insulating coating, such as glass, a plastics or ceramic material.

In dependence upon the nature of the gradient coils required in a particular application, they may require no separate cooling over and above that provided to cool the primary coil. If additional cooling is required, this may be achieved by placing the gradient coils in one or more tubular members, within which a cooling fluid may be passed. In this case, the filaments may be suspended within the tubular members or may be formed on the internal walls of the tubular members.

Figure 2:
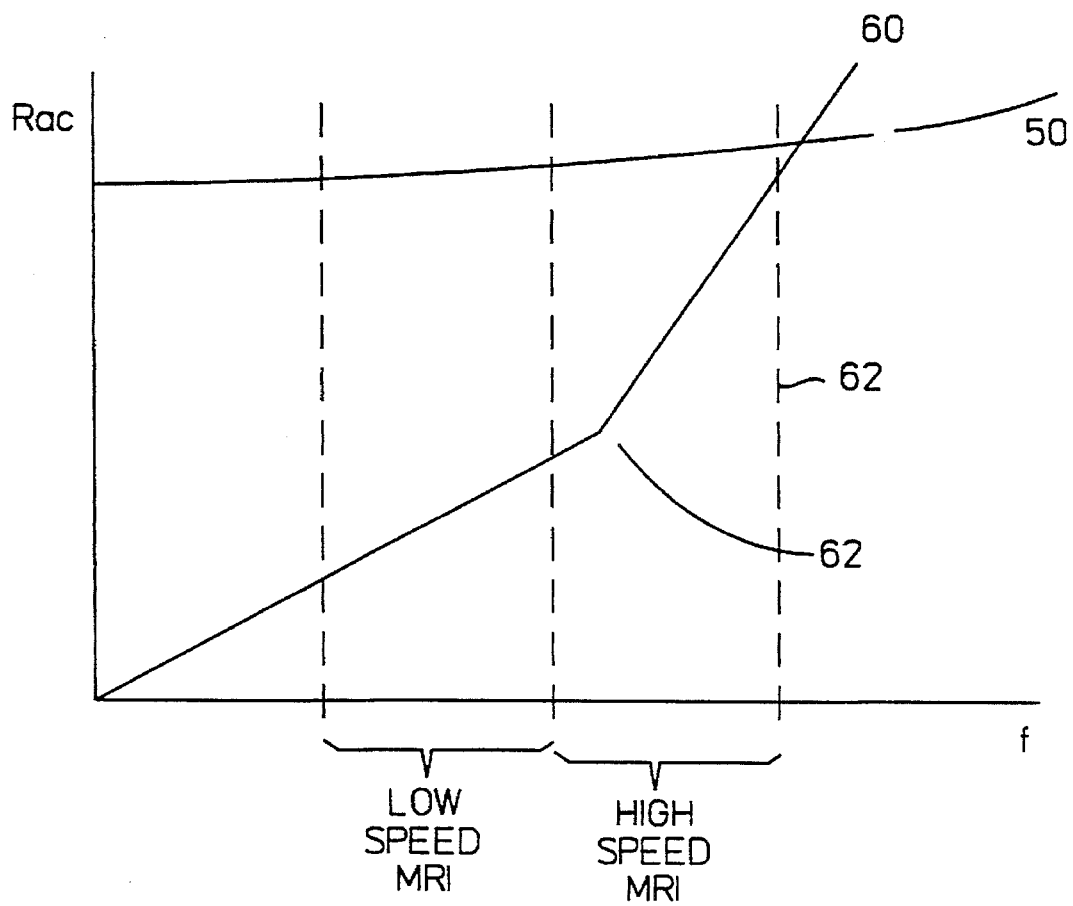
FIG. 2 is a graph of a.c. resistance against frequency for a copper conductor and for a superconductive wire.

An embodiment of the present invention is described below, by way of example only, with reference to the accompanying drawings, in which:

FIG. 1 is a schematic cross-sectional diagram of part of an embodiment of magnet assembly disposed within a system housing; and FIG. 2 is a graph of a.c. resistance against frequency for a copper conductor and for a super-conductive wire.

Referring to FIG. 1, the embodiment of magnet assembly 10 shown is located, in this example, within the housing 12 of a magnetic resonance imaging system of the type used for obtaining images of intact biological systems, such as a human being. The system housing 12 is of annular form such that an inner wall 14 thereof and its outermost wall 16 are tubular. The inner wall 14 has a diameter, in this example, of approximately 600 to 650 millimeters and a length of 1 to 2 meters, thereby being suitable to accommodate a human being within the interior of the system. In the preferred embodiment, there are no peripheral components between the primary magnet 22 and the object to be imaged and thus the inner wall of the magnet housing can be of a diameter just sufficient to accommodate the object.

The outermost wall 16 of the housing may be made of any suitable material, typically a metal. Similarly, the inner wall 14 may be made of any suitable material, probably of high resistivity or superconductive material which does not noticeably create transients (for example eddy currents) in the generated fields or otherwise adversely affect these fields.

The magnet assembly 10 includes a heat insulating chamber 18 which is in the form of a vacuum vessel and has walls preferably formed from fibre glass or other suitable material which can reduce or prevent the diffusion of gases through the walls of the chamber 18. The insulating chamber 18 is of annular form and, in this embodiment, extends around the whole of the circumferential dimension of the system housing 12. Within the insulating chamber 18 there is provided a tubular former 20 which is supported by the walls of the insulating housing 18 or by any other suitable support. The former 20 is preferably made from an electrically insulating material and may include a thin metal layer (not shown) for preventing diffusion of gases such as helium, water vapour and the like. A radiation shield, shown cross-hatched, of conventional form is provided around the primary coil.

Coupled to the chamber 18 is a cooling mechanism (not shown) which may include a liquid or gaseous helium source, a cryo-cooler, or any other suitable mechanism. Such a cooling mechanism will be apparent to the skilled person so is not described in detail herein.

Secured on the former 20 is a primary coil 22 of superconductive material which, in this example, consists of six windings around the former 20. These are disposed by known art to produce an extremely homogeneous magnetic field. Any known superconductive material may be used for the primary coil of this embodiment.

Also disposed within the heat insulating chamber 18 are three or three sets of gradient coils 24, each of which is operative to generate on application of an alternating current thereto field pulses which create field gradients within the interior of the system housing. These field gradients generated are the x, y and z direction gradients known in the art.

In the first embodiment shown, the field coils 24 are disposed on the same side of the former 20 as the primary coil 22 and are mechanically secured to the former in any suitable manner, either directly on the former or by one or more magnet formers (not shown). The second embodiment shown has gradient coils 24' disposed on the opposite side of the former 20 relative to the primary coil 22, these being mechanically secured to the former 20 in similar manner to the gradient coils 24 of the first embodiment. The gradient coils 24, 24' are also located within the radiation shield.

In order to reduce the intensity of stray fields between one type of coil and the next, the gradient coils 24, 24' are preferably spaced from the coils of the primary magnet 22. This is more important when the gradient coils 24, 24' are disposed on the same side of the former 20 as the primary coil 22, in which case each gradient coil can be positioned in the space between adjacent coils of the primary magnet 22. As will be evident, the spacing of the gradient coils from the primary coil 22 is less important in the case where the gradient coils 24' are located at the opposite side of the former 20.

The gradient coils 24, 24' are of a nature which does not adversely affect the performance of the primary coil 22 by elevating the temperature within the chamber 18 too much. For example, in cases where the system can be operated a relatively low speed, the gradient coils can be conventional wires of superconductive material with an insulating cladding, since the heat generated during use can be kept at a level less than the rate at which the cooling mechanism can remove heat from within the chamber 18.

On the other hand, in cases where the system is to be used at high frequency, for example at a frequency at which images of a human being are generated virtually in real time, the gradient coils 24, 24' are designed so as to generate heat at a lower rate than the rate at which the cooling mechanism can remove heat from within the chamber 18. The preferred manner of achieving this objective can be appreciated with reference to FIG. 2, which shows a graph of alternating current resistivity against frequency. As will be appreciated by the skilled reader, an increase the resistivity of the gradient coil will determine the amount of power dissipation during use of the coils and thereby the amount of generated heat energy which must be removed.

Graph 50 depicts the resistivity of a copper coil of the type used for conventional gradient coils. Graph 60 depicts the resistivity for an equivalent wire of superconductive material.

As can be seen, both types of material experience an increase in resistivity with increasing frequency, the copper coil having a substantially constant resistivity until fairly high operating frequencies, while the superconductive coil has a resistivity which increases an a first rate from zero resistivity until a predetermined operating frequency and thereafter a resistivity which increases at a greater rate. This elbow in the resistivity curve for conventional superconductive wires occurs within the frequency band required to generate high speed magnetic resonance images. Thus, as will be appreciated from the graph of FIG. 2, it may be more advantageous to use conventional copper gradient coils in a conventional magnet assembly, rather than a superconductive gradient coils, in cases where the assembly is to be used at high imaging speeds.

The preferred embodiments of gradient coil seek to delay the point 62 at which the resistivity characteristic of the superconductive material changes so as have a lower resistivity than conventional copper coils at the higher operating frequencies.

The preferred embodiments at this time involve producing each gradient coil 24, 24' as a filament or a bundle of superconductive filaments having, in the preferred example, a diameter in the order of 0.1 micrometers. Filaments dissipate less power at high frequencies and will therefore generate less heat. However, filaments known in the art are usually clad in a metal matrix for support. In high frequency applications of the type contemplated herein, the metal matrix can give additional power losses and it is therefore preferred to use other forms of matrix between the filament.

In a first embodiment, the gradient filaments are produced from conventional metal clad superconductive filaments from which the cladding is removed, for example by etching, and replaced by an insulating coating, such as glass, a plastics or ceramic material.

In another embodiment, bare filaments may be supported on an insulating substrate. The filaments may then be covered with an insulating layer or may be left bare for enhancing cooling.

The gradient coil filaments can be produced by extrusion into an insulating or resistive matrix or may be formed by a film deposition process in which a superconductive film is deposited onto a resistive substrate or by any other suitable means.

The preferred film deposition process involves depositing a superconductive alloy on an insulating substrate with high heat conductivity, such as sapphire, alumina, various ceramics or diamond. Such a heat conductive substrate can provide thermal stabilisation against quenches and can minimise electric power dissipation in the substrate. The film deposition may be by a process of sputtering, by chemical vapour deposition, by flash evaporation or by any other suitable process. In very high frequency applications, the filaments may be provided within a tubular conduit though which a cooling fluid such as liquid or gaseous helium can be passed. If additional cooling is required, this may be achieved by placing the gradient coils in one or more tubular conduits, within which a cooling fluid may be passed. In this case, the filaments may be suspended within the tubular conduits or may be formed on the internal walls of the tubular conduits.

We claim:

1. A superconductive magnet assembly comprising a primary magnet formed of a primary coil of superconductive material, a magnet former supporting the primary coil, one or more gradient coils of superconductive material operative to produce field gradients during operation of the magnet, the one or more gradient coils being supported by the magnet former, and a heat insulating housing within which the primary coil and the one or more gradient coils are housed.

2. A magnet assembly according to claim 1, wherein the housing includes a vacuum vessel.

3. A magnet assembly according to claim 2, wherein the vacuum vessel includes a thin metal layer to prevent diffusion.

4. A magnet assembly according to claim 1, wherein the housing is cooled by a cryo-refrigerator.

5. A magnet assembly according to claim 1 wherein the one or more gradient coils are designed so as to dissipate heat at a lower rate than the rate at which the refrigerator can absorb heat.

6. A magnet assembly according to claim 1, wherein the magnet former is formed of electrically non-conductive material.

7. A magnet assembly according to claim 1, wherein the magnet former is of tubular form, the primary coil being disposed on one side of the magnet former.

8. A magnet assembly according to claim 1, wherein one or more gradient coils are formed from one or more superconductive filaments.

9. A magnet assembly according to claim 8, wherein the one or more superconductive filaments are supported on an electrically insulating support.

10. A magnet assembly according to claim 9, wherein the electrically insulating support includes sapphire, alumina, a ceramic material or diamond.

11. A magnet assembly according to claim 9, wherein the superconductive filaments are produced from metal clad superconductive filaments from which the cladding is removed and replaced by an insulating coating.

12. A magnet assembly according to claim 8, wherein the superconductive filaments are disposed in one or more tubular conduits within which a cooling fluid can be passed.

* * * * *